(12) United States Patent
Kim et al.

(10) Patent No.: US 10,741,586 B2
(45) Date of Patent: Aug. 11, 2020

(54) TRANSISTOR ARRAY PANEL AND MANUFACTURING METHOD THEREOF

(71) Applicant: Samsung Display Co., Ltd., Yongin-si (KR)

(72) Inventors: Tae Gyun Kim, Hwaseong-si (KR); Jae-Yong Ka, Seoul (KR); Pil Soon Hong, Gwangmyeong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/516,149

(22) Filed: Jul. 18, 2019

(65) Prior Publication Data

US 2019/0341405 A1    Nov. 7, 2019

Related U.S. Application Data

(62) Division of application No. 15/790,197, filed on Oct. 23, 2017, now Pat. No. 10,396,096.

(30) Foreign Application Priority Data

Dec. 19, 2016    (KR) ........................ 10-2016-0173551

(51) Int. Cl.
*H01L 27/12* (2006.01)
*H01L 29/786* (2006.01)
(Continued)

(52) U.S. Cl.
CPC ...... *H01L 27/1222* (2013.01); *H01L 27/1259* (2013.01); *H01L 27/1288* (2013.01);
(Continued)

(58) Field of Classification Search
CPC .......................... H01L 27/1222; H01L 27/1259
See application file for complete search history.

(56) References Cited

U.S. PATENT DOCUMENTS

2006/0281211 A1*  12/2006  Yoon ................... G02F 1/13394
                                                       438/34
2009/0218568 A1*   9/2009  Dairiki .................... H01L 29/04
                                                       257/57
(Continued)

FOREIGN PATENT DOCUMENTS

| KR | 10-0183891 | 12/1998 |
|----|------------|---------|
| KR | 10-2010-0023151 | 3/2010 |
| KR | 10-1281463 | 6/2013 |

OTHER PUBLICATIONS

Non-Final Office Action dated Aug. 16, 2018, issued in U.S. Appl. No. 15/790,197.
(Continued)

*Primary Examiner* — Lex H Malsawma
*Assistant Examiner* — Xia L Cross
(74) *Attorney, Agent, or Firm* — H.C. Park & Associates, PLC

(57) ABSTRACT

A transistor array panel includes a transistor which includes a gate electrode, a semiconductor layer on the gate electrode, and a source electrode and a drain electrode on the semiconductor layer. The semiconductor layer includes a first portion overlapping the source electrode, a second portion overlapping the drain electrode, and a third portion between the first portion and the second portion. The first portion, the second portion, and the third portion have different minimum thicknesses.

10 Claims, 25 Drawing Sheets

(51) Int. Cl.
    *H01L 29/66* (2006.01)
    *H01L 27/32* (2006.01)
    *G02F 1/1368* (2006.01)

(52) U.S. Cl.
    CPC .. *H01L 29/66765* (2013.01); *H01L 29/66969* (2013.01); *H01L 29/78618* (2013.01); *H01L 29/78624* (2013.01); *H01L 29/78696* (2013.01); *G02F 1/1368* (2013.01); *H01L 27/3262* (2013.01)

(56) References Cited

U.S. PATENT DOCUMENTS

2011/0140111 A1* 6/2011 Jeong .................... H01L 33/16
                                              257/59
2012/0273780 A1* 11/2012 Yamazaki ........... H01L 27/1225
                                              257/43
2013/0285047 A1   10/2013 Yamazaki et al.

OTHER PUBLICATIONS

Final Office Action dated Dec. 13, 2018, issued in U.S. Appl. No. 15/790,197.
Notice of Allowance dated Apr. 9, 2019, issued in U.S. Appl. No. 15/790,197.

* cited by examiner

TRANSISTOR ARRAY PANEL AND MANUFACTURING METHOD THEREOF

CROSS-REFERENCE TO RELATED APPLICATION

This application is a Divisional Application of U.S. patent application Ser. No. 15/790,197, filed on Oct. 23, 2017, which claims priority from and benefit of Korean Patent Application No. 10-2016-0173551, filed on Dec. 19, 2016, and entitled: "Transistor Array Panel and Manufacturing Method Thereof," is incorporated by reference herein in its entirety.

BACKGROUND

1. Technical Field

One or more embodiments described herein relate to a transistor array panel and a method for manufacturing a transistor array panel.

2. Description of the Related Art

A display device generates images using a plurality of pixels. Each pixel emits light using transistors. Some transistors operate as switches and other transistors drive light emission from the pixels. The display device may also include driver circuits for generate a scanning signal for transmission on gate lines and data signals for transmission on data lines.

A continuing trend in the industry is to increase the resolution of displays, while at the same time reducing transistor size, e.g., channel length. However, reducing channel length has limitations and may adversely affect performance and display quality.

SUMMARY

In accordance with one or more embodiments, a transistor array panel includes a substrate; and a transistor on the substrate, wherein: the transistor includes a gate electrode, a semiconductor layer on the gate electrode, and a source electrode and a drain electrode on the semiconductor layer, and the semiconductor layer includes a first portion overlapping the source electrode, a second portion overlapping the drain electrode, and a third portion between the first portion and the second portion, the first portion, the second portion, and the third portion having different minimum thicknesses. The minimum thickness of the third portion may be less than the minimum thickness of each of the first portion and the second portion.

The transistor may include an ohmic contact layer between the semiconductor layer and the source electrode, and an ohmic contact layer between the semiconductor layer and the drain electrode. A thickness of a first end of the third portion may correspond to a thickness of the first portion connected to the first end. A thickness of a second end of the third portion may correspond to a thickness of the second portion connected to the second end.

The minimum thickness of the first portion may be greater than the minimum thickness of the second portion. The minimum thickness of the first portion may be less than the minimum thickness of the second portion. A difference between the minimum thickness of the first portion and the minimum thickness of the third portion, or a difference between the minimum thickness of the second portion and the minimum thickness of the third portion, may be about 100 angstroms or more.

A thickness of an edge portion of the semiconductor layer may correspond to the minimum thickness of the third portion. The transistor array panel may include a protection layer including a contact hole overlapping the drain electrode; and a pixel electrode connected to the drain electrode through the contact hole.

In accordance with one or more other embodiments, a method for manufacturing a transistor array panel includes forming a gate electrode on a substrate; forming a gate insulating layer to cover the gate electrode; sequentially forming a semiconductor layer, a first ohmic contact layer, and a first conductive layer on the gate insulating layer, and patterning the first conductive layer, the first ohmic contact layer, and the semiconductor layer; and sequentially forming a second ohmic contact layer and a second conductive layer, and patterning the second conductive layer and the second ohmic contact layer.

Patterning the first conductive layer may include forming a first-stage photosensitive film pattern including first and second portions of different thicknesses on the first conductive layer; and etching the first conductive layer using the first-stage photosensitive film pattern as a mask. The first ohmic contact layer and semiconductor layer may include forming a second-stage photosensitive film pattern by etching back the first-stage photosensitive film pattern, and etching the first ohmic contact layer and semiconductor layer using the patterned first conductive layer as a mask.

The method may include, after etching the semiconductor layer, etching the patterned first conductive layer using the second-stage photosensitive film pattern as a mask to form a source electrode or a drain electrode. The method may include, after the forming of the source electrode or the drain electrode, etching the patterned first ohmic contact layer using the second-stage photosensitive film pattern as a mask to form an ohmic contact layer overlapping the source electrode or the drain electrode.

Patterning the second conductive layer and the second ohmic contact layer may include etching the second conductive layer using a photosensitive film pattern as a mask to form the drain electrode or the source electrode; and etching the second ohmic contact layer using the photosensitive film pattern as a mask to form an ohmic contact layer overlapping the drain electrode or the source electrode.

Patterning the first ohmic contact layer and the semiconductor layer may include etching the first ohmic contact layer and the semiconductor layer using the first-stage photosensitive film pattern as a mask.

The method may include, after etching the semiconductor layer, etching back the first-stage photosensitive film pattern to form a second-stage photosensitive film pattern, and etching the patterned first conductive layer using the second-stage photosensitive film pattern as a mask to form a source electrode or a drain electrode.

The method may include, after forming the source electrode or the drain electrode, etching the patterned first ohmic contact layer using the second-stage photosensitive film pattern as a mask to form an ohmic contact layer overlapping the source electrode or the drain electrode.

Patterning the second conductive layer and the second ohmic contact layer may include etching the second conductive layer using a photosensitive film pattern as a mask to form the drain electrode or the source electrode; and etching the second ohmic contact layer using the photosensitive film pattern as a mask to form an ohmic contact layer overlapping the drain electrode or the source electrode.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
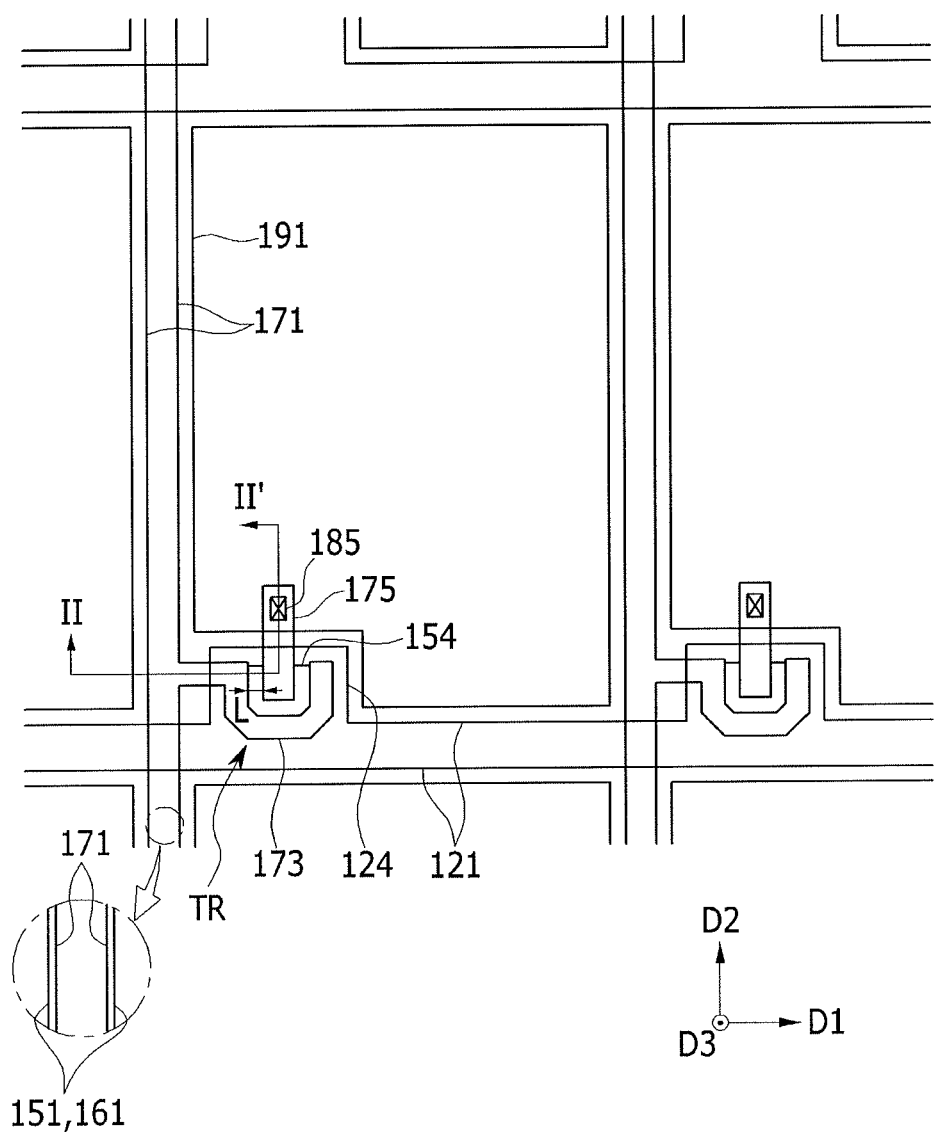
FIG. 1 illustrates an embodiment of a transistor array panel.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
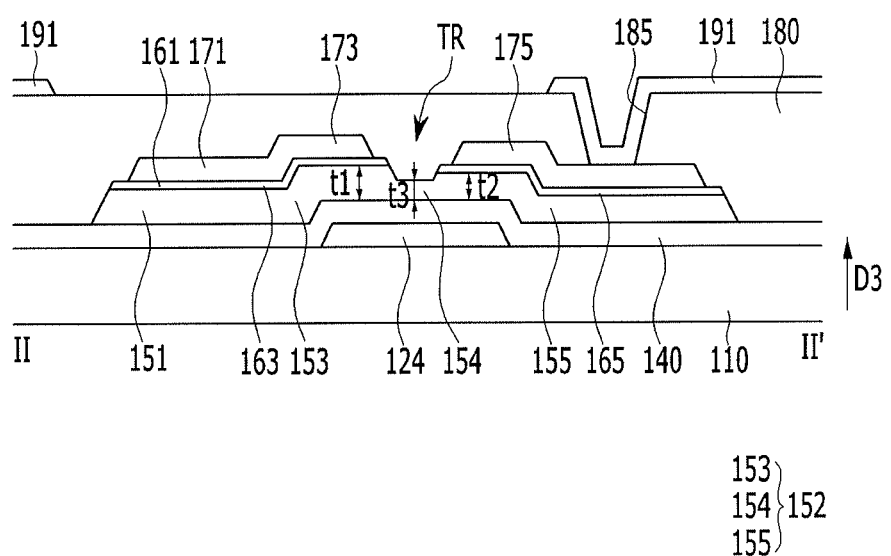
FIG. 2 illustrates an embodiment taken along section line II-II' in FIG. 1.

FIG. 1 illustrates a layout view of an embodiment of a transistor array panel, and FIG. 2 illustrates a cross-sectional view of an exemplary embodiment taken along line II-II' in FIG. 1. In the drawings, a first direction D1 and a second direction D2 are perpendicular to each other and are parallel with a side that is seen from a direction that is perpendicular to a plane of a substrate 110. A third direction D3 is perpendicular to the first and second directions D1 and D2 and is substantially perpendicular to the plane of the substrate 110.

Also, the third direction D3 may be generally expressed in a cross-sectional structure and may be called a cross-sectional direction or a thickness direction. A structure that is visible when the side in parallel with the first direction D1 and the second direction D2 is observed may be referred to as a planar structure. When a first constituent element is provided on a second constituent element in the cross-sectional structure, the two constituent elements may be arranged in the third direction D3, and a third constituent element may be between the first and second constituent elements.

Referring to FIGS. 1 and 2, the transistor array panel includes transistors TR on a substrate 110. The substrate 110 may be made of an insulating material such as glass or plastic, and may be optically transparent.

The transistor TR includes a gate electrode 124, a semiconductor layer 152, a source electrode 173, and a drain electrode 175. An ohmic contact layer 163 is between the semiconductor layer 152 and the source electrode 173. An ohmic contact layer 165 is between the semiconductor layer 152 and the drain electrode 175. A gate insulating layer 140 is between the semiconductor layer 152 and the gate electrode 124. A channel region of the transistor TR is on a portion of the semiconductor layer 152 between the source electrode 173 and the drain electrode 175. A channel length L of the transistor TR may correspond to a distance (or gap) between the source electrode 173 and the drain electrode 175. According to the present exemplary embodiment, the channel length L may be less than 3.8 micrometers, less than about 3 micrometers, or less than about 2 micrometers. The channel length L may be different in another embodiment.

The source electrode 173 and the drain electrode 175 may be determined by the direction in which carriers flow through the channel of the semiconductor layer 152, when a gate-on voltage is applied to the gate electrode 124. In one embodiment, the carriers may flow to the drain electrode 175 from the source electrode 173. Therefore, when the transistor TR is operated, electrons flow to the drain electrode 175 from the source electrode 173 in the case of an n-type transistor, and holes flow to the drain electrode 175 from the source electrode 173 in the case of a p-type transistor.

The semiconductor layer 152 includes a first portion 153 overlapping the source electrode 173, a second portion 155 overlapping the drain electrode 175, and a third portion 154 between the first portion 153 and the second portion 155. The third portion 154 may correspond to a channel region of the transistor TR. The first portion 153, the second portion 155, and the third portion 154 of the semiconductor layer 152 have different thicknesses. For example, the first portion 153 has a first thickness t1 that is the greatest, the second portion 155 has a second thickness t2 that is less than the first thickness t1, and the third portion 154 has a third thickness t3 that is less than the second thickness t2.

In one embodiment, a difference (t1−t2) between the first thickness t1 and the second thickness t2 may substantially correspond to a difference (t2−t3) between the second thickness t2 and the third thickness t3. In one embodiment, the difference (t1−t2) may be different from the difference (t2−t3), e.g., the former may have a value that is about ¼ to 7/4 times the latter. In one embodiment, the difference (t1−t2) between the first thickness t1 and the second thickness t2 and the difference (t2−t3) between the second thickness t2 and the third thickness t3 may respectively be equal to or greater than about 50 angstroms. In one embodiment, the difference (t1−t3) between the first thickness t1 and the third thickness t3 may be equal to or greater than about 100 angstroms.

The thickness may correspond to a thickness in the third direction D3 that is perpendicular to the plane of the substrate 110. In one embodiment, the first thickness t1, the second thickness t2, and the third thickness t3 may correspond to minimum thicknesses of the first portion 153, the second portion 155, and the third portion 154. For example, the thickness of the semiconductor layer 152 may correspond to a distance between a bottom side of the semiconductor layer 152 and a top side of the semiconductor layer 152 that is formed to be substantially parallel to the bottom side. The term "minimum" thickness may be used because the thickness may not be completely uniform depending on the manufacturing process, and a relatively thicker portion may be generated because of a curve in the layers. This may also be because the second portion 155 could include portions with different thicknesses.

In FIG. 2, a tapered portion (which does not overlap the drain electrode 175) on the right of a second portion 155 of the semiconductor layer 152 may be thinner than the second thickness t2. A portion (covered by the ohmic contact layer 163) near the first portion 153 on the third portion 154 may be equal to the first thickness t1. A portion (covered by the ohmic contact layer 165) near the second portion 155 may be equal to the second thickness t2. The thickness of a semiconductor layer 151 overlapping the data line 171 may be equal to the first thickness t1 of the first portion 153 of the semiconductor layer 152. The thickness of the tapered portion of the semiconductor layer 151 may be thinner than the first thickness t1.

Regarding the semiconductor layer 152 of the transistor TR, the thickness differences of the first portion 153, the second portion 155, and the third portion 154 may result from forming the source electrode 173, the ohmic contact layer 163, and the semiconductor layer 152 using one mask and forming the drain electrode 175 and the ohmic contact layer 165 using another mask. The above-structured transistor TR may have a reduced channel length, compared to the transistor which includes the source electrode 173, the drain electrode 175, the ohmic contact layers 163 and 165, and the semiconductor layer 152 formed using one mask. This may also reduce the size of the transistor TR. Accordingly, a greater number of transistors and pixels per area may be formed, thereby increasing resolution of the display device. In the case of the liquid crystal display, the size of the pixel (e.g., the aperture ratio) may be increased to thereby improve luminance.

The transistor array panel includes gate lines 121 for transmitting gate signals including a gate-on voltage and a gate-off voltage extending in the first direction D1. A gate electrode 124 of the transistor TR may be connected to the gate line 121, and may be provided on a same layer in a cross-sectional view. The gate electrode 124 may protrude from the gate line 121. The gate line 121 and the gate electrode 124 may include a metal such as copper, aluminum, silver, molybdenum, chromium, tantalum, or titanium, or a metal alloy thereof, and may be a single layer or a multilayer.

The gate insulating layer 140 including an inorganic insulating material (e.g., silicon nitride (SiNx) or silicon oxide (SiOx)) is on the gate electrode 124. The gate insulating layer 140 may be a single layer or a multilayer.

Semiconductor layers 151 and 152 are on the gate insulating layer 140. The semiconductor layer 151 mainly extends in the second direction D2. The semiconductor layer 152 of the transistor TR may be connected to the semiconductor layer 151 and may be on a same layer in a cross-sectional view. The semiconductor layer 152 may protrude from the semiconductor layer 151. The semiconductor layers 151 and 152 may include amorphous silicon, polysilicon, or a metal oxide.

The ohmic contact layers 161, 163, and 165 are on the semiconductor layers 151 and 152. The ohmic contact layers 163 and 165 make a pair and are provided on the semiconductor layer 152. The ohmic contact layers 161, 163, and 165 may include material such as n+ amorphous silicon doped with an n-type impurity at a high concentration, or a silicide.

The data line 171 is on the ohmic contact layer 161, and the source electrode 173 and the drain electrode 175 of the transistor TR are on the ohmic contact layers 163 and 165. The data line 171 transmits a data signal and mainly extends in the second direction D2 and may traverse the gate line 121. The source electrode 173 may protrude from the data line 171. A portion of the data line 171 may form the source electrode 173. In FIG. 1, the shapes of the source electrode 173 and the drain electrode 175 in a plane view are shown to be a U and an I. These shapes may be different in another embodiment. The data line 171, the source electrode 173, and the drain electrode 175 may include a metal such as copper, aluminum, silver, molybdenum, chromium, tantalum, or titanium, or a metal alloy thereof, and they may be a single layer or a multilayer.

The ohmic contact layers 161, 163, and 165 are between the semiconductor layers 151 and 152 and the data line 171, the source electrode 173, and the drain electrode 175 above the same to reduce contact resistance. The ohmic contact layers 161, 163, and 165 may substantially have the same planar shape as the data line 171, the source electrode 173, and the drain electrode 175, e.g., corresponding edges of these constituent elements may correspond to each other in a top plan view, or if not, their edges may be parallel to each other at a substantially regular interval.

FIG. 2 shows an example in which the edges of the ohmic contact layers 161, 163, and 165 extend beyond the edges of the data line 171, the source electrode 173, and the drain electrode 175. For example, the ohmic contact layers 161, 163, and 165 may include portions that do not overlap the data line 171, the source electrode 173, and the drain electrode 175, respectively.

A portion of the semiconductor layer 152 is not covered by the ohmic contact layers 163 and 165. Except for this portion, semiconductor layer 152 may substantially have the same planar shape as the ohmic contact layers 163 and 165 and the source and drain electrodes 173 and 175. The semiconductor layer 151 may substantially have the same planar shape as the ohmic contact layer 161 and the data line 171.

A protection layer 180 is on the data line 171, the source electrode 173, and the drain electrode 175. The protection layer 180 may include an inorganic insulating material or an organic insulating material, and may be a single layer or a multilayer. The protection layer 180 includes a contact hole 185 overlapping the drain electrode 175.

Pixel electrodes 191 are on the protection layer 180 and are connected to the drain electrode 175 through the contact hole 185. The pixel electrode 191 may receive a data voltage from the drain electrode 175. The pixel electrode 191 may include a transparent conductive material such as an indium tin oxide (ITO) or an indium zinc oxide (IZO). When the display device is a liquid crystal display, a liquid crystal layer is provided on the pixel electrode 191. The pixel electrode 191 generates an electric field with a common electrode to control the direction (orientation) of liquid crystal molecules of the liquid crystal layer. When the display device is an organic light emitting device, an organic emission layer is on the pixel electrode 191. The pixel electrode 191 and the organic emission layer may configure an organic light emitting diode that is a light-emitting device, with a common electrode.

Figure 3:
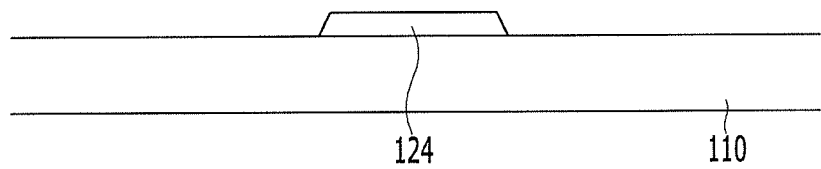
FIG. 3 to FIG. 12 illustrate various stages of an embodiment of a method for manufacturing a transistor array panel.

FIGS. 3 to 12 illustrates various stages of an embodiment of a method for manufacturing a transistor array panel, e.g., as illustrated in FIG. 2. Referring to FIG. 3, a conductive material such as a metal or a metal alloy is stacked on the substrate 110 to form a gate conductive layer, and the gate conductive layer is patterned to form a gate electrode 124. When the gate conductive layer is patterned, the gate line 121 may be formed together with the gate electrode 124. The gate conductive layer may be patterned when a photosensitive material such as photoresist is stacked to form a photosensitive film. A first mask is used to pattern the photosensitive film. The patterned photosensitive film is used as a mask to, for example, wet-etch the gate conductive layer.

Figure 4:
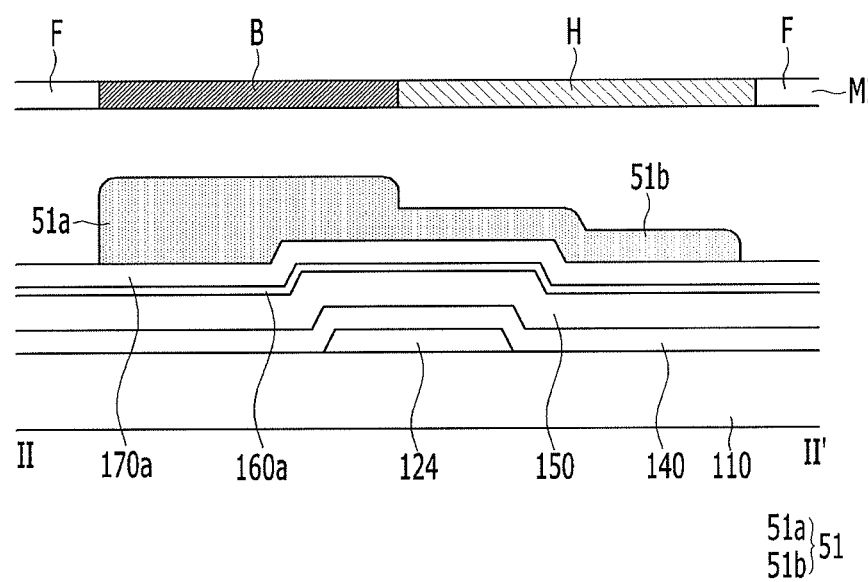

Referring to FIG. 4, a gate insulating layer 140, a semiconductor layer 150, a first ohmic contact layer 160a, and a first conductive layer 170a are sequentially stacked on the substrate 110 on which the gate electrode 124 is formed. The gate insulating layer 140 may be formed, for example, by stacking an inorganic insulating material such as a silicon nitride or a silicon oxide. The semiconductor layer 150 may be formed by stacking a semiconductor material such as amorphous silicon. The first ohmic contact layer 160a may be formed by stacking an impurity-doped material such as n+ amorphous silicon. The first conductive layer 170a may be exemplarily formed by stacking a conductive material such as a metal or a metal alloy.

A photosensitive film may be formed on the first conductive layer 170a, and second mask M2 may be used to pattern the same, to thereby form a first-stage photosensitive film pattern 51. The first-stage photosensitive film pattern 51 includes a relatively thick first portion 51a and a relatively thin second portion 51b. The thickness difference of the first-stage photosensitive film pattern 51 may be provided, for example, using a second mask M2 including a perfect transmission region (F) through which light transmits, a transflective region (H) through which part of light transmits, and a blocking region (B) where light is blocked.

When the photosensitive material has positive photosensitivity (e.g., a location irradiated with light), a first portion 51a of the first-stage photosensitive film pattern 51 may be a portion corresponding to the blocking region (B) of the second mask M2. The second portion 51b may be an exposed portion corresponding to the transflective region (H) of the second mask M2. A portion from which the photosensitive material is perfectly removed and on which the first-stage photosensitive film pattern 51 is not formed may be an exposed portion corresponding to the perfect transmission region (F) of the second mask M2. When the photosensitive material has negative photosensitivity, transparency of the second mask M2 corresponding to the first-stage photosensitive film pattern 51 may be opposite. The second mask M2 may be, for example, a halftone mask. The first-stage photosensitive film pattern 51 may be formed using, for example, a slit mask including a slit pattern or lattice pattern, in addition to the halftone mask.

Figure 5:
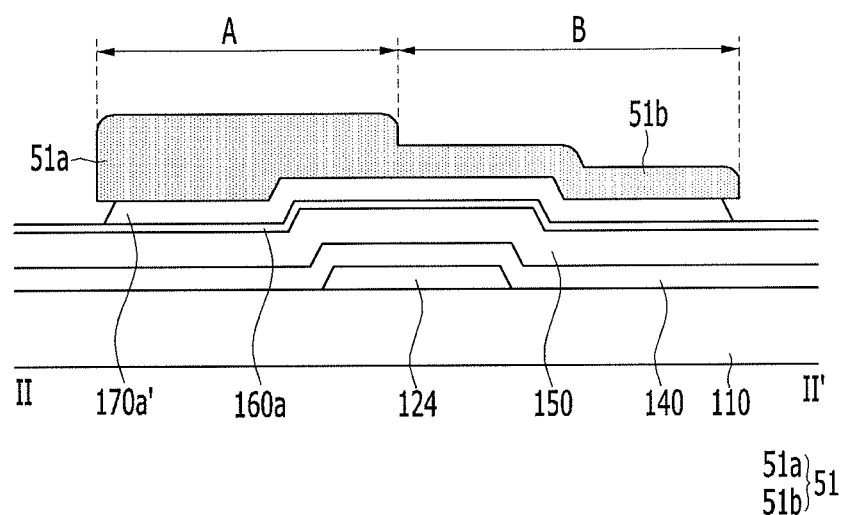

Referring to FIG. 5, the first-stage photosensitive film pattern 51 is used as a mask, and the first conductive layer 170a is patterned, for example, by wet etching to form a first conductive layer pattern 170a'. Because of an isotropic etching characteristic of an etchant, when the first conductive layer 170a is wet etched, an edge of the first conductive layer pattern 170a' may be provided inside the regions (A and B) in which the first-stage photosensitive film pattern 51 is formed, as illustrated in FIG. 5.

Figure 6:
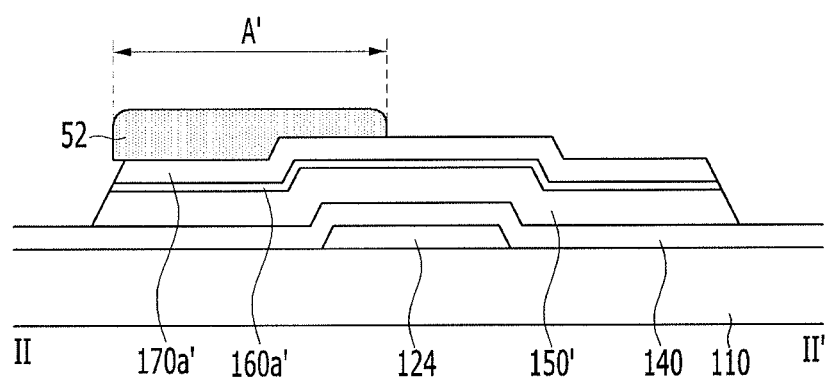

Referring to FIG. 6, the second portion 51b (that is a thin portion of the first-stage photosensitive film pattern 51) is removed by an etch-back process. In this instance, the first portion 51a is also etched to reduce its width and height to form a second-stage photosensitive film pattern 52. The second-stage photosensitive film pattern 52 is formed in a region (A') that is narrower than the regions (A and B) in which the first-stage photosensitive film pattern 51 is formed. The first conductive layer pattern 170a' is used as a mask to pattern the first ohmic contact layer 160a and the semiconductor layer 150, for example, by dry etching, to thereby form a first ohmic contact layer pattern 160a' and a semiconductor layer pattern 150'.

Different from FIGS. 5 and 6, the first-stage photosensitive film pattern 51 may be used as a mask to etch the first ohmic contact layer 160a and the semiconductor layer 150. The first-stage photosensitive film pattern 51 may be etched by an etch-back process to form a second-stage photosensitive film pattern 52. This process may be, for example, substantially the same as a process described with reference to FIGS. 16 and 17.

Figure 7:
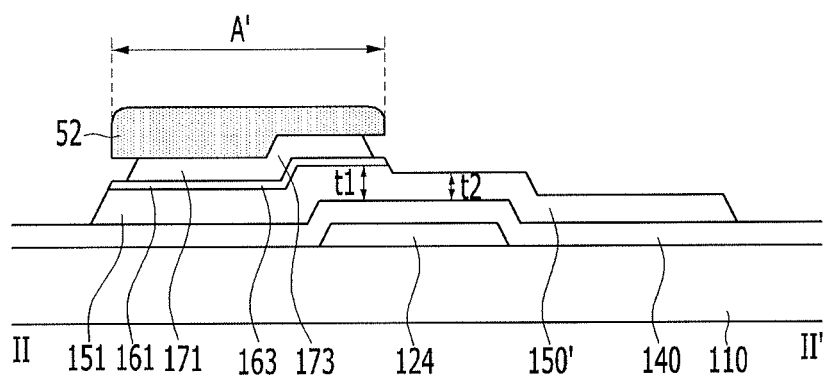

Referring to FIG. 7, the second-stage photosensitive film pattern 52 is used as a mask to, for example, wet-etch the first conductive pattern 170a', to thereby form a source electrode 173 and a data line 171. According to the isotropic etching characteristic, the edges of the source electrode 173 and the data line 171 may be inside the region (A') in which the second-stage photosensitive film pattern 52 is formed. The second-stage photosensitive film pattern 52 is used as a mask to, for example, dry etch the first ohmic contact layer pattern 160a', to thereby form ohmic contacts 161 and 163. The semiconductor layer pattern 150' includes a semiconductor layer 151 overlapping the ohmic contact layer 161.

When the first ohmic contact layer pattern 160a' is etched, a surface of the semiconductor layer pattern 150' not covered by the second-stage photosensitive film pattern 52 may be etched. Accordingly, a portion of the semiconductor layer pattern 150' of the ohmic contact layers 161 and 163 has a first thickness t1 corresponding to a thickness of the first portion 153 of the semiconductor layer 152 in FIG. 2. A portion of the semiconductor layer pattern 150' not covered by the ohmic contact layers 161 and 163 has a second thickness t2 that is less than the first thickness t1 and corresponds to the thickness of the second portion 155 of the semiconductor layer 152 in FIG. 2.

Figure 8:
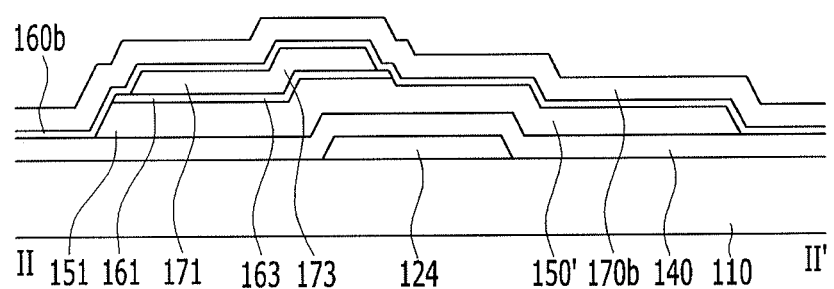

Referring to FIG. 8, after the second-stage photosensitive film pattern 52 is removed, a second ohmic contact layer 160b and a second conductive layer 170b are sequentially stacked. Therefore, the source electrode 173 and the data line 171 may be surrounded by the ohmic contact layers 161 and 163 and the second ohmic contact layer 160b. The second ohmic contact layer 160b may be formed by stacking an impurity-doped material such as n+ amorphous silicon. The second conductive layer 170b may be formed, for example, by stacking a conductive material such as a metal or a metal alloy.

Figure 9:
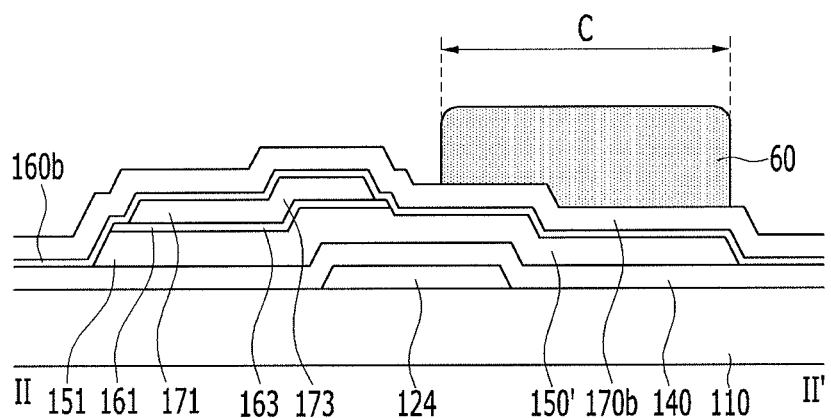

Referring to FIG. 9, a photosensitive film is formed on the second conductive layer 170b and is patterned using a third mask to form a photosensitive film pattern 60. The third mask is different from the second mask M2 and may be a general mask including transmission and blocking regions, and not the halftone mask or the slit mask.

Figure 10:
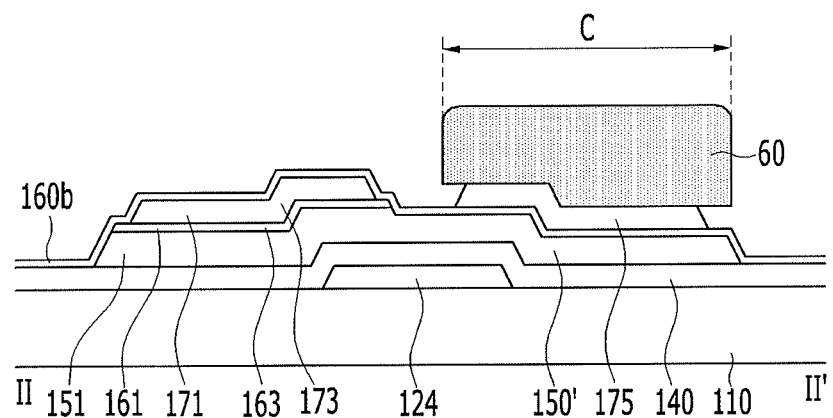

Referring to FIG. 10, the photosensitive film pattern 60 is used as a mask to, for example, pattern the second conductive layer 170b through wet etching and thereby form a drain electrode 175. According to the isotropic etching characteristic, the edge of the drain electrode 175 may be inside the region (C) in which the photosensitive film pattern 60 is formed. The source electrode 173 and the data line 171 generated in the previous stage are covered by the second ohmic contact layer 160b, so the source electrode 173 and the data line 171 are not etched when the second conductive layer 170b for forming the drain electrode 175 is etched.

Figure 11:
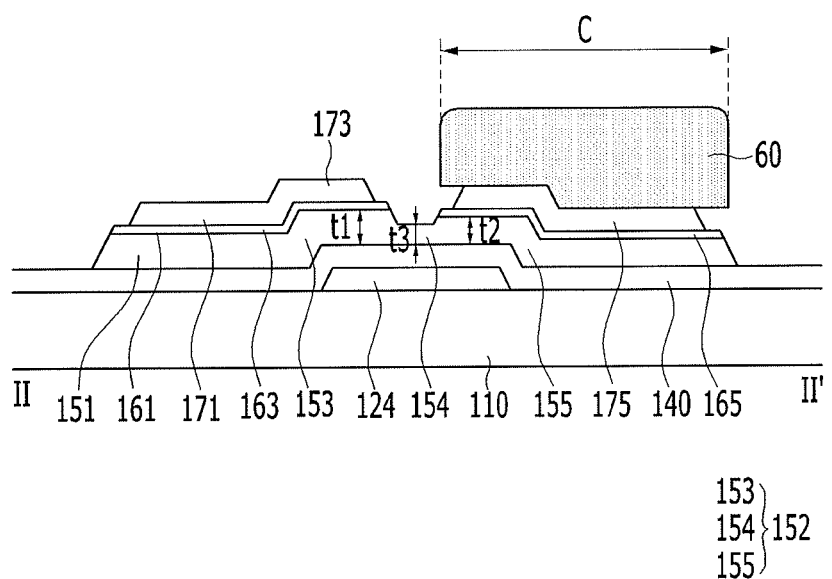

Referring to FIG. 11, the photosensitive film pattern 60 is used as a mask to pattern the second ohmic contact layer 160b, for example, by dry etching, to thereby form an ohmic contact layer 165. When the second ohmic contact layer 160b is etched, the surface of the semiconductor layer pattern 150' that is not covered by the photosensitive film pattern 60 and the ohmic contact layer 163 may be etched. Accordingly, the semiconductor layer pattern 150' forms a third portion 154 of the semiconductor layer 152 having a third thickness t3. The third thickness t3 may be less than second thickness t2 because the portion between the ohmic contact layers 163 and 165 is etched more than the portion overlapping the ohmic contact layer 165. The surface of the first portion 153 of the semiconductor layer 152 overlapping the ohmic contact layer 163 is not etched during the process for manufacturing a transistor TR. Thus, the first thickness t1, that is the original thickness of the semiconductor layer 150, may be maintained.

When the source electrode 173 and the drain electrode 175 are formed together using one mask, it may be difficult to form the channel length to be less than 3.8 micrometers because of performance of the light exposer and diffraction of light. In other words, the minimum channel length that is presently available may be 3.8 micrometers. However, in accordance with one or more embodiments, the gap between the source electrode 173 and the drain electrode 175 may be controlled to be a predetermined size (e.g., smaller than 3.8 micrometers) because the source electrode 173 and the drain electrode 175 are formed with additional or different masks.

Since the channel length corresponds to the gap between the source electrode 173 and the drain electrode 175, the channel length of the transistor TR may be reduced according to the present exemplary embodiment. In the present exemplary embodiment, the ohmic contact layers 163 and 165 are on the same position in a cross-sectional view of the transistor TR, but their stacking orders and formation processes are different.

In like manner, the source electrode 173 and the drain electrode 175 are provided on the same position in a cross-sectional view of the transistor TR, but their stacking orders and formation processes are different. However, two masks (a second mask M2 and a third mask) are used when the semiconductor layer 152, the ohmic contact layers 163 and 165, the source electrode 173, and the drain electrode 175 are formed. For example, one mask is used to pattern the semiconductor layer 150, the first ohmic contact layer 160a, and the first conductive layer 170a, and another mask is used to pattern the second ohmic contact layer 160b and the second conductive layer 170b. Therefore, according to the present exemplary embodiment, the channel length may be reduced and the use of masks may be reduced or minimized.

Figure 12:
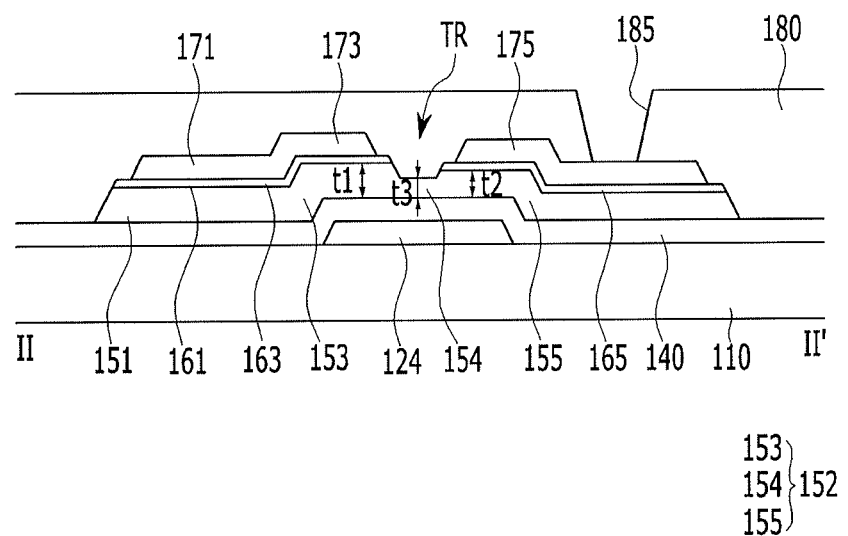

Referring to FIG. 12, an inorganic insulating material and/or an organic insulating material are/is stacked to form a protection layer 180, a photosensitive film is formed thereon, and a fourth mask is used to pattern the same to form a contact hole 185 for exposing the drain electrode 175. A conductive material (such as an ITO or a TZO) is stacked to form a conductive layer, a photosensitive film is formed thereon, and a fifth mask is used to pattern the same to form a pixel electrode 191 connected to the drain electrode 175, as in FIG. 2.

An embodiment of a method for manufacturing a transistor array panel with the configuration illustrated in FIGS. 1 and 2 has been described. In one embodiment, five masks may be used to reduce the channel length of the transistor TR, to reduce or minimize the use of masks, and to reduce manufacturing costs. A different number of masks may be used in another embodiment.

FIGS. 3 to 12 illustrate an embodiment for forming the source electrode 173 and the data line 171 and then forming the drain electrode 175. In another embodiment, the drain electrode 175 may be formed and the source electrode 173 and the data line 171 may then be formed. In one embodiment, the second thickness t2 of the second portion 155 may be greater than the first thickness t1 of the first portion 153 of the semiconductor layer 152.

Figure 13:
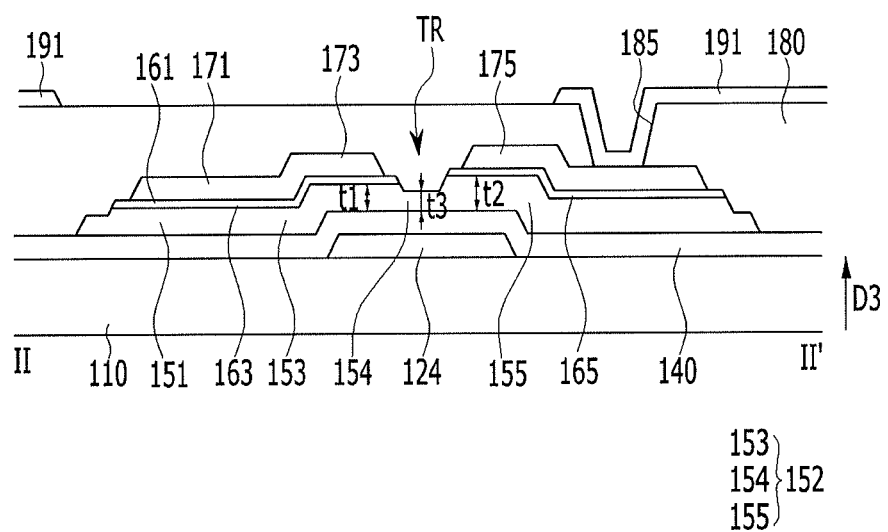
FIG. 13 illustrates another embodiment taken along section line II-II' in FIG. 1.

FIG. 13 illustrates another embodiment of a cross-sectional view take along line II-II' of FIG. 1. Referring to FIGS. 1 and 13, the transistor array panel includes a transistor TR on a substrate 110. The transistor TR includes a gate electrode 124, a semiconductor layer 152, a source electrode 173, and a drain electrode 175, and includes ohmic contact layers 163 and 165 provided among the semiconductor layer 152, the source electrode 173, and the drain electrode 175. A gate insulating layer 140 is provided between the semiconductor layer 152 and the gate electrode 124. The gate line 121 may be on a same layer as the gate electrode 124. The data line 171 may be on a same layer as the source electrode 173. The channel length L may correspond to a gap between the source electrode 173 and the drain electrode 175 and may be less than 3.8 micrometers, less than about 3 micrometers, or less than about 2 micrometers.

Different from the embodiment of FIG. 2, regarding the semiconductor layer 152 of the transistor TR in the exemplary embodiment of FIG. 13, the first thickness t1 of the first portion 153 overlapping the source electrode 173 is less than the second thickness t2 of the second portion 155 overlapping the drain electrode 175. A third portion 154 between the first portion 153 corresponding to a channel region of the transistor TR and the second portion 155 has the least a third thickness t3.

In a like manner of an exemplary embodiment of FIG. 2, the first thickness t1, the second thickness t2, and the third thickness t3 may represent the minimum thicknesses of the first portion 153, the second portion 155, and the third portion 154, respectively. A difference (t2−t1) between the first thickness t1 and the second thickness t2 may substantially correspond to a difference (t1−t3) between the first thickness t1 and the third thickness t3. In one embodiment, the difference (t2−t1) may be ¼ to 7/4 times the difference (t1−t3).

The thickness of the semiconductor layer 151 overlapping the data line 171 may correspond to the first thickness t1 of the first portion 153 of the semiconductor layer 152. On the third portion 154, a portion (covered by the ohmic contact layer 163) near the first portion 153 may correspond to the first thickness t1. A portion (covered by the ohmic contact layer 165) near the second portion 155 may correspond to the second thickness t2. Edge portions (e.g., a left edge portion of the semiconductor layer 151 and a right edge portion of the third portion 154 in FIG. 13) of the semiconductor layers 151 and 152 may not be covered by the ohmic contact layers 161, 163, and 165. The thickness of the portions (except a tapered portion) may be substantially equal to the third thickness t3.

Regarding the semiconductor layer 152 of the transistor TR, the thicknesses of the first portion 153, the second portion 155, and the third portion 154 are different. This may result from the drain electrode 175, the ohmic contact layer 165, and the semiconductor layer 152 being formed using one mask. The source electrode 173, the data line 171, and the ohmic contact layer 163 are formed using another mask. Like the exemplary embodiment of FIG. 2, the transistor TR with the above-noted configuration may, for example, reduce the channel length, compared to the transistor having a source electrode 173, drain electrode 175, ohmic contact layers 163 and 165, and semiconductor layer 152 formed using one mask. The reduced channel length may allow the size of the transistor TR to be reduced. Accordingly, resolution of the display device may be increased and aperture ratio of pixels may be increased.

Figure 14:
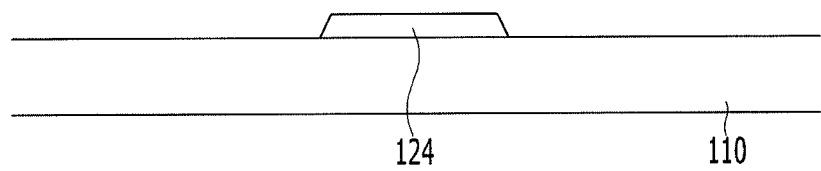
FIG. 14 to FIG. 23 illustrate various stages of another embodiment of a method for manufacturing a transistor array panel.

FIG. 14 to FIG. 23 illustrate various stages of an embodiment of a method for manufacturing a transistor array panel, for example, as illustrated in FIG. 13. Referring to FIG. 14, a conductive material such as a metal or a metal alloy is stacked on the substrate 110 to form a gate conductive layer. The gate conductive layer is patterned to form a gate electrode 124. When the gate conductive layer is patterned, a gate line 121 may be formed with the gate electrode 124. The gate conductive layer may be patterned, for example, by forming a photosensitive film, patterning the photosensitive film using a first mask, and etching the gate conductive layer using the patterned photosensitive film as a mask.

Figure 15:
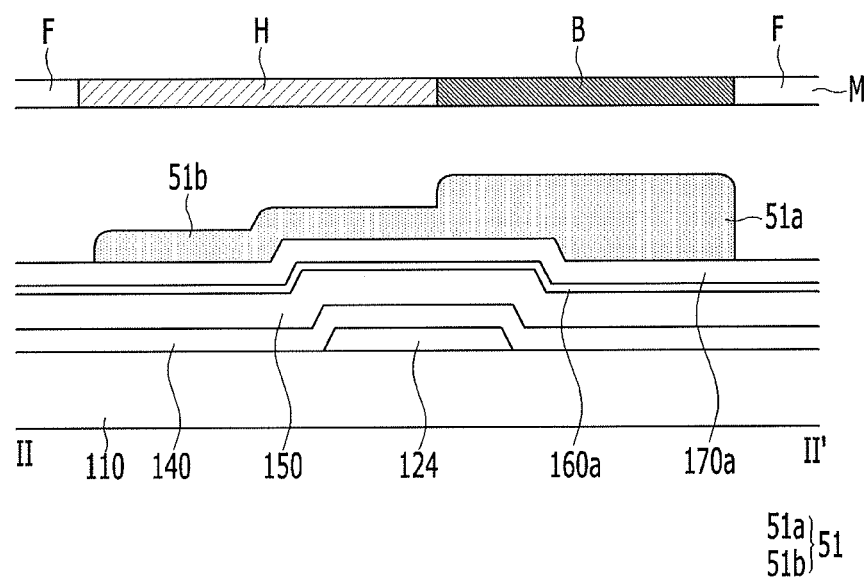

Referring to FIG. 15, a gate insulating layer 140, a semiconductor layer 150, a first ohmic contact layer 160a, and a first conductive layer 170a are sequentially stacked on the substrate 110 which includes the gate electrode 124. A photosensitive film is formed on the first conductive layer 170a. A second mask M2 is used to pattern the photosensitive film to form a first-stage photosensitive film pattern 51. The first-stage photosensitive film pattern 51 includes a relatively thick first portion 51a and a relatively thin second portion 51b. Thickness differences of the first-stage photosensitive film pattern 51 may be formed, for example, using a second mask M2 which includes a perfect transmission region (F), a transflective region (H), and a blocking region (B). The second mask M2 may be, for example, a halftone mask or a slit mask.

Figure 16:
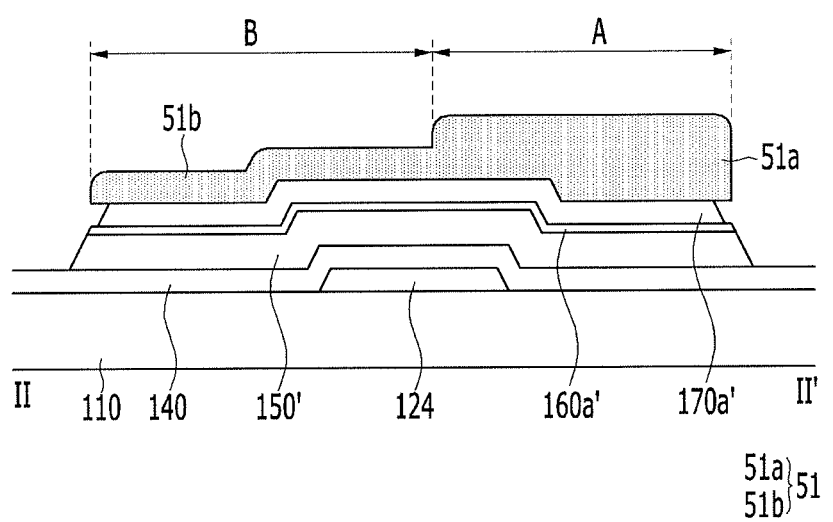

Referring to FIG. 16, the first-stage photosensitive film pattern 51 is used as a mask to, for example, wet etch the first conductive layer 170a and thereby form a first conductive layer pattern 170a'. Because of an isotropic etching characteristic, when the first conductive layer 170a is wet etched, an edge of the first conductive layer pattern 170a' may be provided inside the regions (A and B) in which the first-stage photosensitive film pattern 51 is formed, as in FIG. 16. The first-stage photosensitive film pattern 51 is used as a mask to etch the first ohmic contact layer 160a and the semiconductor layer 150, and thereby form a first ohmic contact layer pattern 160a' and a semiconductor layer pattern 150'.

Figure 17:
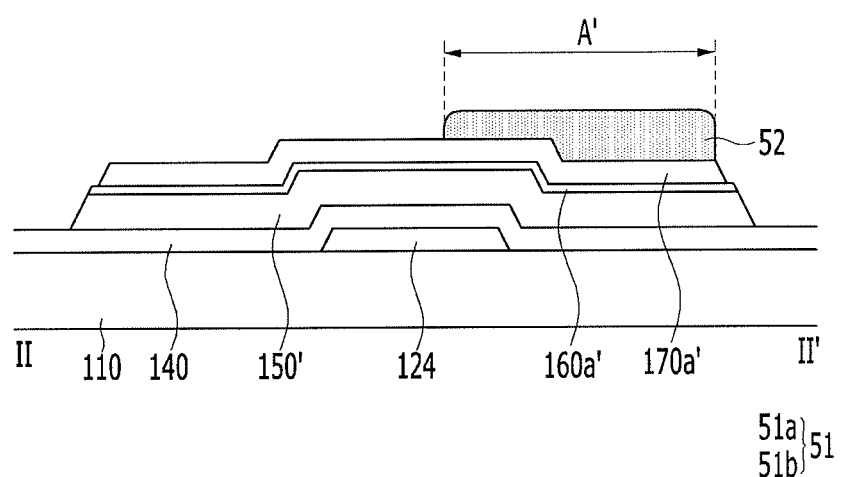

Referring to FIG. 17, a second portion 51b (that is a thin portion of the first-stage photosensitive film pattern 51) is removed by an etch-back process. In this instance, the first portion 51a is etched altogether to reduce its width and height and thereby form a second-stage photosensitive film pattern 52. The second-stage photosensitive film pattern 52 is formed in a region (A') that is narrower than the regions (A and B) in which the first-stage photosensitive film pattern 51 is formed.

Unlike FIGS. 16 and 17, the first conductive layer 170a may be etched with the first-stage photosensitive film pattern 51, a second-stage photosensitive film pattern 52 may be formed after etch-back of the first-stage photosensitive film pattern 51, and the first conductive layer pattern 170a' may be used as a mask to etch the first ohmic contact layer 160a and the semiconductor layer 150. The above-noted process may, for example, substantially correspond to the process described with reference to FIGS. 5 and 6.

Figure 18:
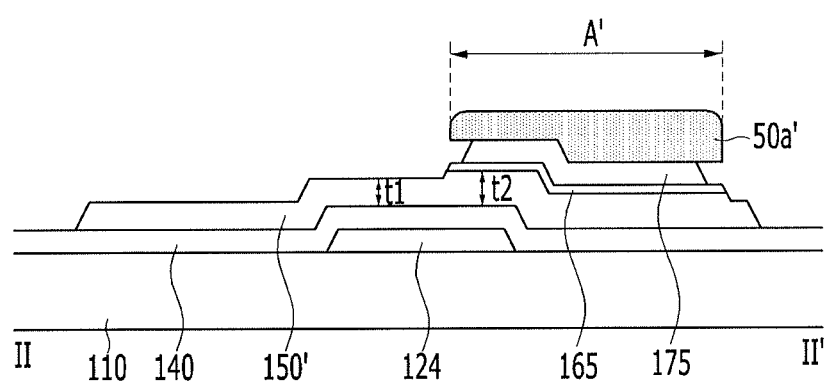

Referring to FIG. 18, the first conductive layer pattern 170a' is patterned, for example, through wet etching using the second-stage photosensitive film pattern 52 as a mask to form a drain electrode 175. Because of the isotropic etching characteristic, an edge of the drain electrode 175 may be provided inside the region (A') in which the second-stage photosensitive film pattern 52 is formed. The secondary photosensitive film pattern 52 is used as a mask to, for example, dry etch the first ohmic contact layer pattern 160a' and thereby form an ohmic contact layer 165. When the first ohmic contact layer 160a is etched, a surface of the semiconductor layer pattern 150' not covered by the second-stage photosensitive film pattern 52 may be etched. Accordingly, the portion of the semiconductor layer pattern 150' covered by the ohmic contact layer 163 has a second thickness t2 that corresponds to the thickness of the second portion 155 of the semiconductor layer 152 in FIG. 13. The portion of the semiconductor layer pattern 150' not covered by the ohmic contact layer 165 has a first thickness t1 that is less than the second thickness t2 and corresponds to the thickness of the first portion 153 of the semiconductor layer 152 in FIG. 13.

Figure 19:
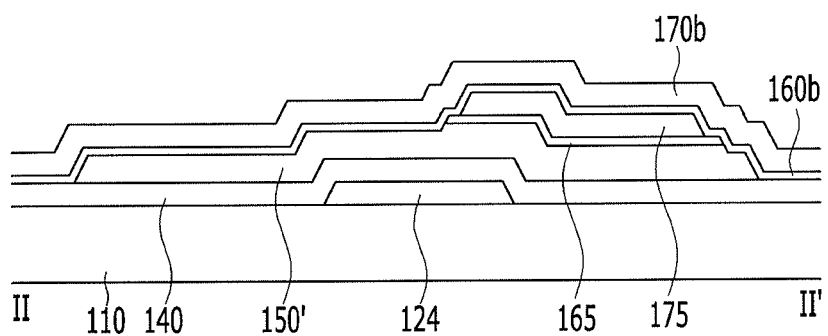

Referring to FIG. 19, the second-stage photosensitive film pattern 52 is removed, and the second ohmic contact layer 160b and the second conductive layer 170b are sequentially stacked. Therefore, the drain electrode 175 may be surrounded by the ohmic contact layer 163 and the second ohmic contact layer 160b.

Figure 20:
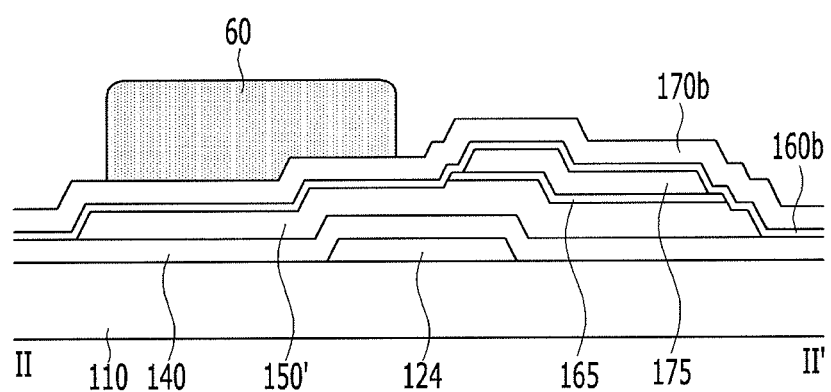

Referring to FIG. 20, a photosensitive film is formed on the second conductive layer 170b and patterned with a third mask to form a photosensitive film pattern 60.

Figure 21:
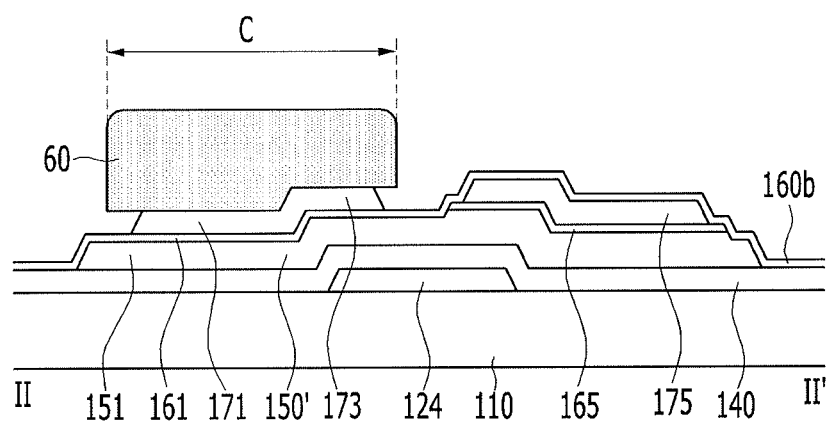

Referring to FIG. 21, the photosensitive film pattern 60 is used as a mask to pattern the second conductive layer 170b, for example, through wet etching and thereby form a data line 171 and a source electrode 173. Because of the isotropic etching characteristic, an edge of the source electrode 173 may be provided inside the region (C) in which the photosensitive film pattern 60 is formed. When the second conductive layer 171b is etched, the drain electrode 175 is covered by the second ohmic contact layer 160b so it is not etched.

Figure 22:
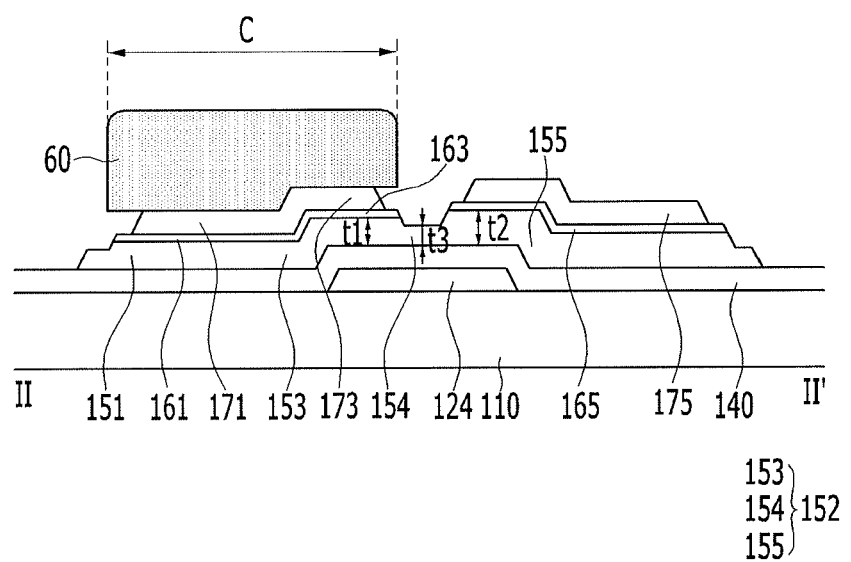

Referring to FIG. 22, the photosensitive film pattern 60 is used as a mask to pattern the second ohmic contact layer 160b, for example, through dry etching to thereby form ohmic contact layers 161 and 163. When the second ohmic contact layer 160b is etched, the surface of the semiconductor layer 150 not covered by the photosensitive film pattern 60 and the ohmic contact layer 165 may be etched. Accordingly, the semiconductor layer pattern 150' is etched, more than the portion between the ohmic contact layers 163 and 165 overlapping the ohmic contact 163, to form a third portion 154 of the semiconductor layer 152 with a third thickness t3 less than the first thickness t1.

During the process for manufacturing transistor TR, the surface of the second portion 155 of the semiconductor layer 152 overlapping the ohmic contact layer 165 is not etched, thereby maintaining the second thickness t2 that is the original thickness of the semiconductor layer 150. In FIG. 22, the surface of a right portion of the second portion 155 not overlapping the ohmic contact layer 163 is etched when the second ohmic contact layer 160b is etched and may have substantially the same thickness as the third thickness t3. The surface on a left portion of the semiconductor layer 151 not overlapping the ohmic contact layer 161 may have substantially the same thickness as the third thickness t3.

In the present exemplary embodiment, the drain electrode 175 and the source electrode 173 are formed using different masks (e.g., second mask M2 and a third mask), to thereby reduce the channel length of the transistor TR. The ohmic contact layers 163 and 165 are on the same layer in a cross-sectional structure of the transistor TR, but their stacking orders and forming processes are different. Similarly, the source electrode 173 and the drain electrode 175 are on the same layer in a cross-sectional structure of the transistor TR, but their stacking orders and forming processes are different.

However, when the semiconductor layer 152, the ohmic contact layers 163 and 165, the source electrode 173, and the drain electrode 175 are formed, two masks are used. For example, one mask is used to pattern the semiconductor layer 150, the first ohmic contact layer 160a, and the first conductive layer 170a. Another mask is used to pattern the second ohmic contact layer 160b and the second conductive layer 170b. Therefore, the channel length of the transistor TR may be reduced and use of masks may be reduced.

Figure 23:
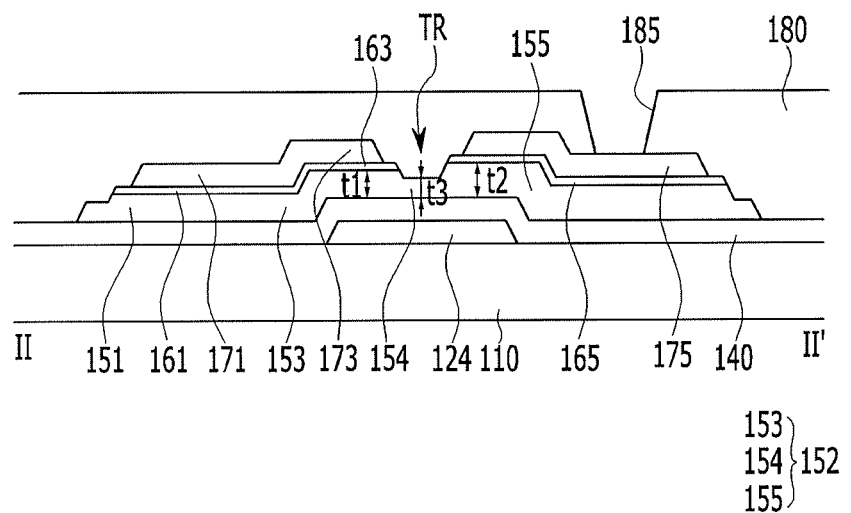

Referring to FIG. 23, an inorganic insulating material and/or an organic insulating material is stacked to form a protection layer 180, and a photosensitive film is formed thereon and patterned with a fourth mask to form a contact hole 185 for exposing the drain electrode 175. A transparent conductive material such as an ITO or an TZO is stacked to form a conductive layer, and a photosensitive film is formed thereon and patterned with a fifth mask to form a pixel electrode 191 connected to the drain electrode 175, as illustrated in FIG. 13.

In the process for manufacturing a transistor array panel according to the present exemplary embodiment, five masks may be used and the channel length of the transistor TR and use of masks may be reduced or minimized. As a result, manufacturing costs may be reduced.

FIGS. 14 to 23 illustrate the case where the drain electrode 175 is formed and then the source electrode 173 and the data line 171 are formed. In one embodiment, the source electrode 173 and the data line 171 may be formed and then the drain electrode 175 may be formed. In this case, a first thickness t1 of the first portion 153 of the semiconductor layer 152 may be greater than a second thickness t2 of the second portion 155.

Figure 24:
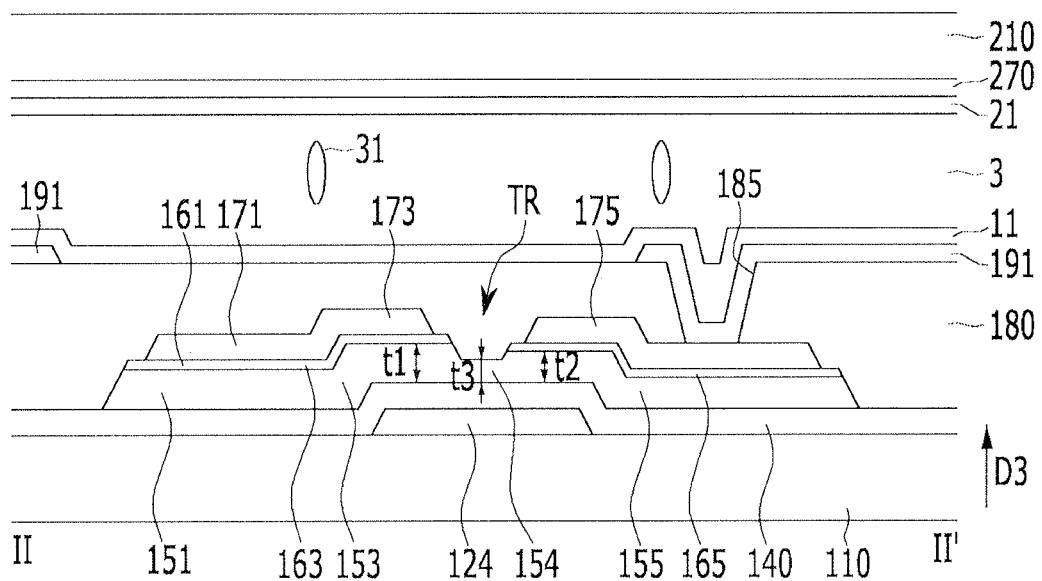
FIG. 24 illustrates another embodiment of a transistor array panel.

FIG. 24 illustrates a cross-sectional view of another embodiment of a display device including a transistor array panel. The display device is a liquid crystal display which includes a transistor array panel according to the above-described exemplary embodiment.

Referring to FIG. 24, a liquid crystal layer 3 including liquid crystal molecules 31 is provided on the pixel electrode 191. A substrate 110 and an insulating layer 210 for sealing the liquid crystal layer 3 are provided on the liquid crystal layer 3. The insulating layer 210 may have, for example, a substrate shape.

A common electrode 270 and a pixel electrode 191 are provided for generating an electric field for controlling the arrangement direction of liquid crystal molecules 31 in the liquid crystal layer 3. The common electrode 270 and a pixel electrode 191 are provided on different sides of the liquid crystal layer, and an insulating layer 210 is on the common electrode 270. In one embodiment, the common electrode 270 may be between the substrate 110 and the liquid crystal layer 3. The common electrode 270 may include a transparent conductive material such as an ITO or an IZO.

Alignment layers 11 and 21 may be between the liquid crystal layer 3 and the insulating layer 210 and between the liquid crystal layer 3 and the pixel electrode 191. The alignment layers 11 and 21 may control initial alignment of the liquid crystal molecules 31 when an electric field is not generated on the liquid crystal layer 3. The alignment layers 11 and 21 may be adjacent to the liquid crystal layer 3.

Figure 25:
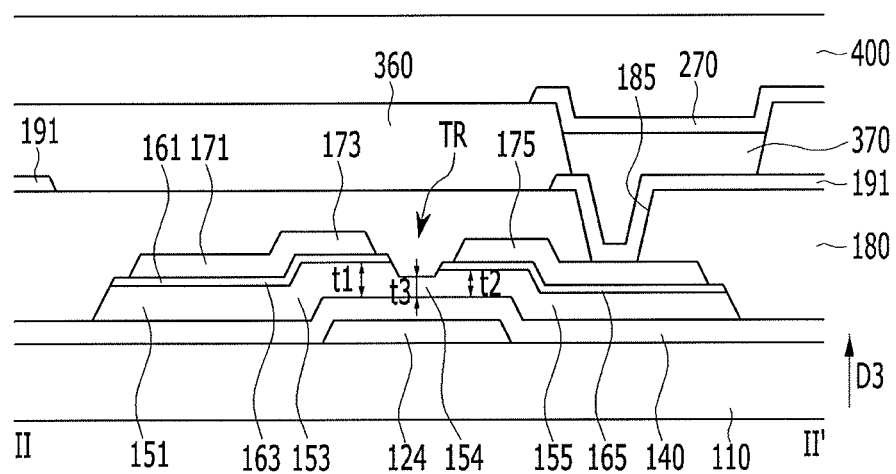
FIG. 25 illustrates another embodiment of a transistor array panel.

FIG. 25 illustrates a cross-sectional view of another embodiment of a display device including a transistor array panel. The display device is an organic light emitting display device which includes a transistor array panel.

A pixel definition layer 360 is on the protection layer 180 and the pixel electrode 191. The pixel definition layer 360 includes an opening overlapping the pixel electrode 191. The pixel definition layer 360 may include a resin such as polyacrylics or polyimides, or an inorganic material such as silica.

An emission layer 370 is on the pixel electrode 191 in the opening of the pixel definition layer 360. The common electrode 270 is on the emission layer 370. The pixel electrode 191, the emission layer 370, and the common electrode 270 form an organic light emitting diode. The pixel electrode 191 may be an anode of the organic light emitting diode. The common electrode 270 may be a cathode of the organic light emitting diode. An encapsulation layer 400 may be provided on the common electrode 270 to protect the organic light emitting diode.

The transistor array panel according to the aforementioned embodiments may be included in various kinds of display devices.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A method for manufacturing a transistor array panel, comprising:

forming a gate electrode on a substrate;

forming a gate insulating layer to cover the gate electrode;

sequentially forming a semiconductor layer, a first ohmic contact layer, and a first conductive layer on the gate insulating layer;

patterning the first conductive layer, the first ohmic contact layer, and the semiconductor layer;

sequentially forming a second ohmic contact layer and a second conductive layer; and patterning the second conductive layer and the second ohmic contact layer, wherein the patterning steps are conducted to form the semiconductor layer to include a first portion with a first thickness t1 between the first conductive layer and the gate electrode, a second portion with a second thickness t2 between the second conductive layer and the gate electrode, and a third portion with a third thickness t3 between the first portion and the second portion, and wherein the second thickness t2 is less than the first thickness t1, and the third thickness t3 is less than the second thickness t2.

2. The method as claimed in claim 1, wherein patterning the first conductive layer includes:

forming a first-stage photosensitive film pattern including a first portion and a second portion with different thicknesses on the first conductive layer; and etching the first conductive layer using the first-stage photosensitive film pattern as a mask.

3. The method as claimed in claim 2, wherein patterning the first ohmic contact layer and the semiconductor layer includes:

forming a second-stage photosensitive film pattern by etching back the first-stage photosensitive film pattern, and etching the first ohmic contact layer and the semiconductor layer using the patterned first conductive layer as a mask.

4. The method as claimed in claim 3, further comprising:

after etching the semiconductor layer, etching the patterned first conductive layer using the second-stage photosensitive film pattern as a mask to form a source electrode or a drain electrode.

5. The method as claimed in claim 4, further comprising:

after the forming of the source electrode or the drain electrode, etching the patterned first ohmic contact layer using the second-stage photosensitive film pattern as a mask to form a first ohmic contact overlapping the source electrode or the drain electrode.

6. The method as claimed in claim 5, wherein patterning the second conductive layer and the second ohmic contact layer includes:

etching the second conductive layer using a photosensitive film pattern as a mask to form the drain electrode or the source electrode; and etching the second ohmic contact layer using the photosensitive film pattern as a mask to form a second ohmic contact overlapping the drain electrode or the source electrode.

7. The method as claimed in claim 2, wherein patterning the first ohmic contact layer and the semiconductor layer includes:

etching the first ohmic contact layer and the semiconductor layer using the first-stage photosensitive film pattern as a mask.

8. The method as claimed in claim 7, further comprising after etching the semiconductor layer:

etching back the first-stage photosensitive film pattern to form a second-stage photosensitive film pattern, and etching the patterned first conductive layer using the second-stage photosensitive film pattern as a mask to form a source electrode or a drain electrode.

9. The method as claimed in claim 8, further comprising after forming the source electrode or the drain electrode:

etching the patterned first ohmic contact layer using the second-stage photosensitive film pattern as a mask to form a first ohmic contact overlapping the source electrode or the drain electrode.

10. The method as claimed in claim 9, wherein patterning the second conductive layer and the second ohmic contact layer includes:

etching the second conductive layer using a photosensitive film pattern as a mask to form the drain electrode or the source electrode; and etching the second ohmic contact layer using the photosensitive film pattern as a mask to form a second ohmic contact overlapping the drain electrode or the source electrode.

\* \* \* \* \*